(12) United States Patent
Yang et al.

(10) Patent No.: US 12,082,479 B2
(45) Date of Patent: Sep. 3, 2024

(54) DISPLAY DEVICE AND METHOD OF MANUFACTURING THE SAME

(71) Applicant: Samsung Display Co., LTD., Yongin-si (KR)

(72) Inventors: Heesung Yang, Seoul (KR); Seung Bae Kang, Suwon-si (KR); Bonggu Kang, Seoul (KR); Tae Wook Kang, Seongnam-si (KR); Joon-Hwa Bae, Suwon-si (KR); Woojin Cho, Yongin-si (KR); Byoung Kwon Choo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 17/324,626

(22) Filed: May 19, 2021

(65) Prior Publication Data

US 2021/0273208 A1    Sep. 2, 2021

Related U.S. Application Data

(63) Continuation of application No. 16/581,993, filed on Sep. 25, 2019, now Pat. No. 11,050,045.

(30) Foreign Application Priority Data

Oct. 23, 2018    (KR) .......................... 10-2018-0126447

(51) Int. Cl.
*H10K 71/00*    (2023.01)
*H01L 21/3105*    (2006.01)
*H01L 21/311*    (2006.01)

(52) U.S. Cl.
CPC ....... *H10K 71/00* (2023.02); *H01L 21/31051* (2013.01); *H01L 21/31127* (2013.01)

(58) Field of Classification Search
CPC ............... H01L 51/56; H01L 21/31127; H01L 21/31051; H01L 27/3276; H01L 21/31058;

(Continued)

(56) References Cited

U.S. PATENT DOCUMENTS 7,663,311 B2    2/2010  Im et al.
8,674,366 B2    3/2014  Suzawa et al.

(Continued)

FOREIGN PATENT DOCUMENTS

CN    104733471    6/2015
CN    106328673    1/2017

(Continued)

OTHER PUBLICATIONS

Korean Office Action with English translation for Korean Patent Application No. 10-2018-0126447, dated May 21, 2023.

(Continued)

*Primary Examiner* — Bac H Au
(74) *Attorney, Agent, or Firm* — KILE PARK REED & HOUTTEMAN PLLC

(57) ABSTRACT

A display device includes a planarization layer covering transistors in a display area on a substrate, an organic light emitting diode on the planarization layer, a pad electrode in a non-display area on the substrate surrounding the display area, and a sacrificial layer remnant capping a side surface of the pad electrode.

15 Claims, 9 Drawing Sheets

(58) Field of Classification Search
CPC ........... H01L 21/31053; H01L 51/5253; H01L 27/3258; H10K 71/00; H10K 59/131; H10K 59/124; H10K 59/1201; H10K 59/00

See application file for complete search history.

(56) References Cited

U.S. PATENT DOCUMENTS

| | | | | |
|---|---|---|---|---|
| 8,829,528 | B2* | 9/2014 | Yamazaki | H01L 27/1262 257/E31.097 |
| 11,164,932 | B2 | 11/2021 | Jeong et al. | |
| 2001/0019133 | A1* | 9/2001 | Konuma | H01L 27/1248 257/40 |
| 2005/0082532 | A1* | 4/2005 | Murakami | H01L 27/3258 438/151 |
| 2005/0211984 | A1* | 9/2005 | Murakami | H01L 27/3244 257/72 |
| 2006/0043360 | A1* | 3/2006 | Kim | H01L 27/3246 257/40 |
| 2006/0091397 | A1 | 5/2006 | Akimoto et al. | |
| 2008/0018229 | A1 | 1/2008 | Yamazaki | |
| 2010/0059754 | A1 | 3/2010 | Lee et al. | |
| 2011/0140114 | A1* | 6/2011 | Ko | H01L 27/3244 438/23 |
| 2011/0156995 | A1* | 6/2011 | Choi | H01L 27/12 257/E21.409 |
| 2016/0020422 | A1* | 1/2016 | Kim | H01L 29/45 257/40 |
| 2016/0218165 | A1* | 7/2016 | Park | H01L 51/56 |
| 2016/0247870 | A1 | 8/2016 | Park et al. | |
| 2017/0005155 | A1 | 1/2017 | You et al. | |
| 2017/0062548 | A1* | 3/2017 | Han | H01L 29/41733 |
| 2017/0081291 | A1 | 3/2017 | Lee et al. | |
| 2017/0092708 | A1* | 3/2017 | Jeon | H01L 27/3258 |
| 2017/0110504 | A1 | 4/2017 | Panchawagh et al. | |
| 2017/0141176 | A1* | 5/2017 | Im | H01L 51/5228 |
| 2018/0366493 | A1* | 12/2018 | Jeong | H01L 29/78621 |
| 2018/0366526 | A1* | 12/2018 | Lee | H01L 29/78621 |
| 2019/0006431 | A1* | 1/2019 | Won | G06F 3/0443 |
| 2020/0127242 | A1* | 4/2020 | Yang | H01L 21/31051 |
| 2020/0161386 | A1 | 5/2020 | Lee et al. | |
| 2020/0168682 | A1 | 5/2020 | Kishimoto | |

FOREIGN PATENT DOCUMENTS

| | | |
|---|---|---|
| CN | 107634083 | 1/2018 |
| JP | 2004-303644 | 10/2004 |
| JP | 2005-268099 | 9/2005 |
| JP | 3918864 | 5/2007 |
| JP | 5648437 | 1/2015 |
| KR | 10-0838082 | 6/2008 |
| KR | 10-2015-0009914 | 1/2015 |
| KR | 10-2015-0072117 | 6/2015 |
| KR | 10-2015-0134953 | 12/2015 |
| KR | 10-2015-0134963 | 12/2015 |
| KR | 10-2016-0010165 | 1/2016 |
| KR | 10-2016-0074801 | 6/2016 |
| KR | 10-1758437 | 7/2017 |
| KR | 10-2018-0057805 | 5/2018 |

OTHER PUBLICATIONS

Korean Office Action with English translation for Korean Application No. 10-2018-0126447, dated Nov. 27, 2023.
Chinese Office Action with English translation for Chinese Application No. 201911011013.8, dated Dec. 15, 2023.
Korean Notice of Allowance with English translation for Korean Patent Application No. 10-2018-0126447, dated Jul. 5, 2024.

* cited by examiner

DISPLAY DEVICE AND METHOD OF MANUFACTURING THE SAME

CROSS-REFERENCE TO RELATED APPLICATION(S)

This is a continuation application of U.S. patent application Ser. No. 16/581,993, filed Sep. 25, 2019 (now U.S. Pat. No. 11,050,045), the disclosure of which is incorporated herein by reference in its entirety. U.S. patent application Ser. No. 16/581,993 claims priority to and benefit of Korean Patent Application No. 10-2018-0126447 under 35 U.S.C. § 119, filed on Oct. 23, 2018, in the Korean Intellectual Property Office, the entire contents of which are incorporated herein by reference.

BACKGROUND

1. Field

Exemplary embodiments of the inventive concept relate to an organic light emitting display device and a method of driving the organic light emitting display device. More particularly, exemplary embodiments of the inventive concept relate to an organic light emitting display device for improving a display quality and a method of driving the organic light emitting display device.

2. Description of the Related Art

Recently, the importance of flat panel display devices having excellent characteristics such as thinness, light weight, and low power consumption has been increasing. Among flat panel display devices, liquid crystal display devices and organic light emitting display devices are widely commercialized because they have excellent resolution and image quality. In particular, the organic light emitting display device is attracting attention as the flat panel display device of a next generation because of their high response speed, low power consumption, and self-luminescence.

SUMMARY

Embodiments are directed to a display device, including a planarization layer covering transistors in a display area on a substrate, an organic light emitting diode on the planarization layer, a pad electrode in a non-display area on the substrate surrounding the display area, and a capping layer capping a side surface of the pad electrode.

The capping layer may include a material having an etch selectivity different from an etch selectivity of the planarization layer.

The pad electrode may include a first layer on the substrate, a second layer on the first layer, and a third layer on the second layer. The capping layer may cap side surfaces of the first and second layers of the pad electrode.

The first layer and the third layer may include titanium (Ti). The second layer may include an aluminum alloy.

The display device may further include a line in the non-display area, the line being connected to the pad electrode. A side surface of the line may be capped by the capping layer.

The line may include the first layer, the second layer and the third layer, which are sequentially stacked. The capping layer may cap side surfaces of the first and second layers of the line.

The organic light emitting diode may include a first electrode formed on the planarization layer, a pixel definition layer including an opening that exposes the first electrode may be formed, an organic light emitting layer in the opening of the pixel definition layer, and a second electrode on the organic light emitting layer.

Embodiments are also directed to a method of manufacturing a display device, including forming a pad electrode on a substrate in a non-display area that surrounds a display area forming a planarization layer on the substrate to have a first thickness, the planarization layer covering a transistor formed in the display area, forming a planarization layer in the display area and a sacrificial layer covering the pad electrode in the non-display area, polishing the planarization layer and the sacrificial layer by a chemical mechanical polishing (CMP) process so that the planarization layer has a second thickness less than the first thickness and so that a sacrificial layer remnant is formed that exposes an upper surface of the pad electrode and caps a side surface of the pad electrode, and forming an organic light emitting diode on the planarization layer having the second thickness.

The sacrificial layer may include a material having an etch selectivity in the chemical mechanical polishing process that is different from an etch selectivity of the planarization layer.

The planarization layer and the sacrificial layer may be polished in the chemical mechanical polishing process using a slurry having a polishing rate ratio different from polishing rate ratios the planarization layer and the sacrificial layer.

The slurry may include a corrosion inhibitor that prevents corrosion of the pad electrode.

The planarization layer may include an organic material and the sacrificial layer may include an inorganic material. The sacrificial layer may be polished using a first slurry for polishing the inorganic material. A partial thickness of the planarization layer may be polished using a second slurry for polishing the organic material.

When the thickness of the sacrificial layer formed on the pad electrode of the non-display area is greater than or equal to the first thickness of the planarization layer, the slurry may be selected so that a polishing rate ratio of the sacrificial layer is greater than the polishing rate ratio of the planarization layer.

When the thickness of the sacrificial layer formed on the pad electrode of the non-display area is less than the first thickness of the planarization layer, the slurry may be selected so that a polishing rate ratio of the sacrificial layer is less than the polishing rate ratio of the planarization layer.

The slurry may be pressed by a hard polishing pad to perform the polishing process.

The pad electrode may include a first layer formed on the substrate, a second layer formed on the first layer, and a third layer formed on the second layer. The sacrificial layer remnant may cap side surfaces of the first and second layers of the pad electrode.

The first layer and the third layer may include titanium (Ti), and the second layer may include an aluminum alloy.

The method may further include forming a line in the non-display area, the line being connected to the pad electrode. A side surface of the line may be capped by the sacrificial layer remnant.

The line may include the first layer, the second layer and the third layer which are sequentially stacked. The capping layer may cap side surfaces of the first and second layers of the line.

Forming the organic light emitting diode may include forming a first electrode on the planarization layer having the second thickness, forming a pixel definition layer in which an opening exposing the first electrode is formed, forming an organic light emitting layer in the opening of the pixel definition layer, and forming a second electrode on the organic light emitting layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
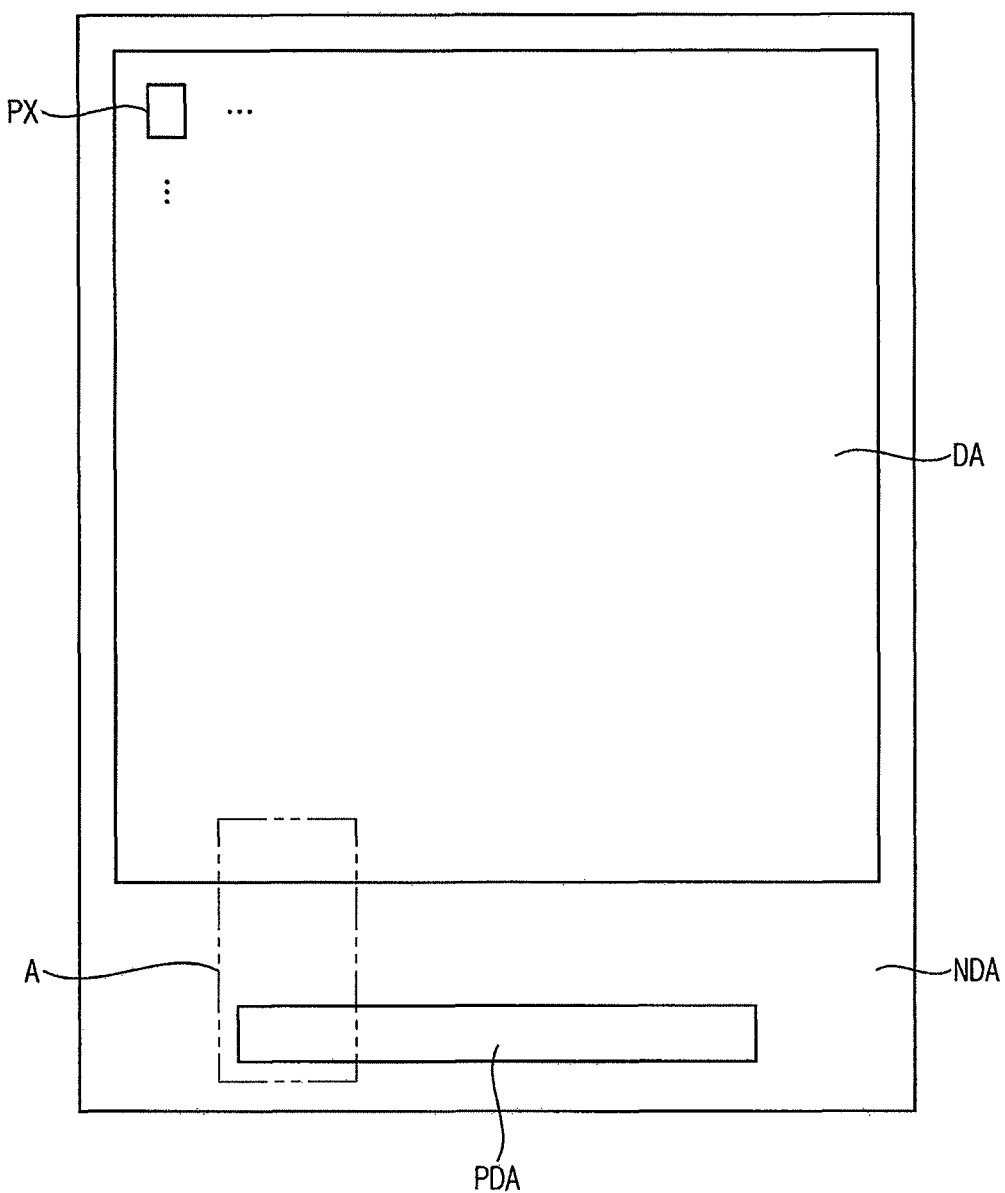
FIG. 1 illustrates a plan view of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a plan view of a display device according to an exemplary embodiment.

Referring to FIG. 1, the display device according to the exemplary embodiment may include a display area DA and a non-display area NDA. A plurality of pixels PX may be disposed in the display area DA. In the display area, images may be displayed based on light emitted by the plurality of pixels PX.

The non-display area NDA may be located on at least one side of the display area DA. For example, the non-display area NDA may surround the display area DA. The non-display area NDA may include a pad area PDA where a plurality of pads 170 is disposed.

Figure 2:
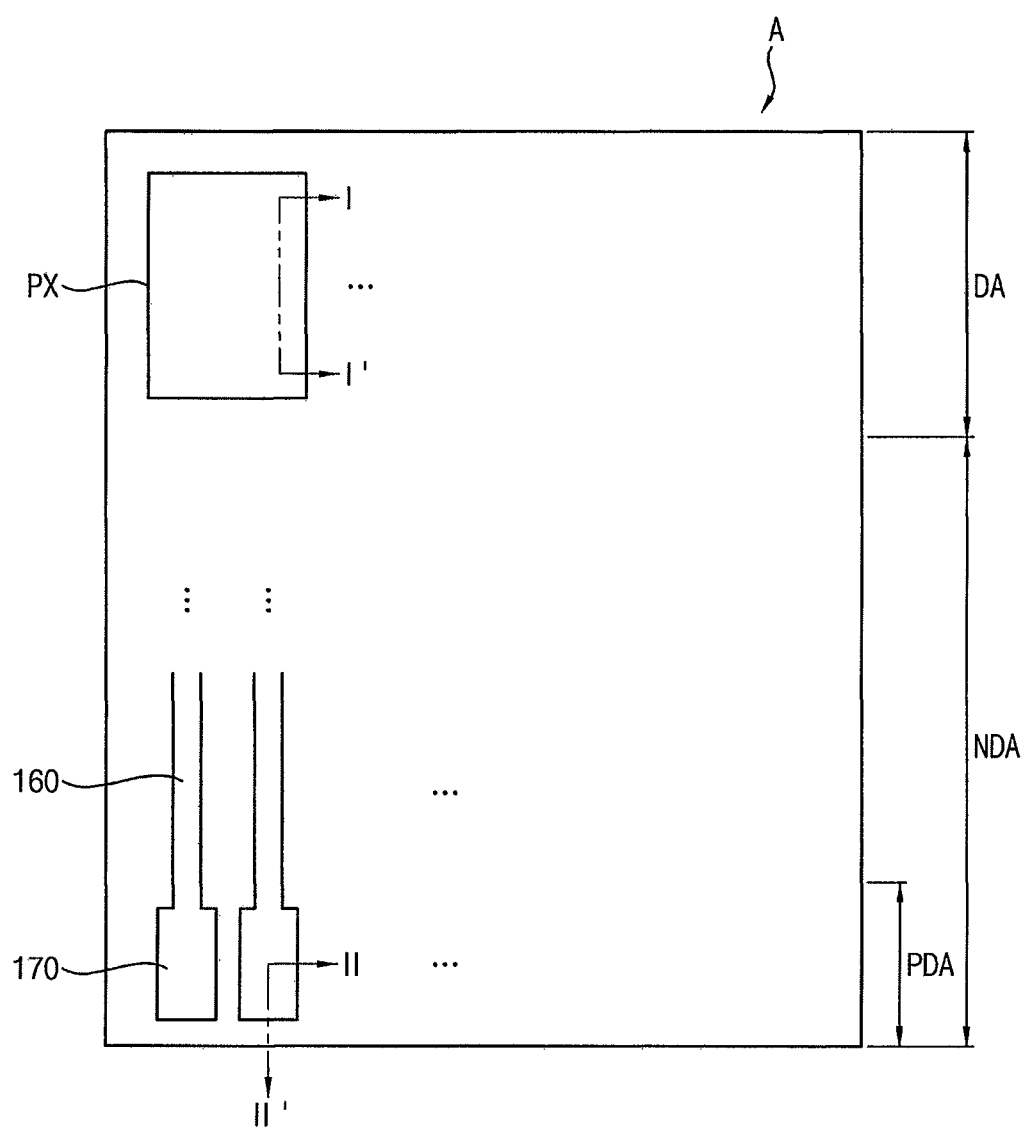
FIG. 2 illustrates an enlarged view of part A of the display device of FIG. 1.
Figure 3:
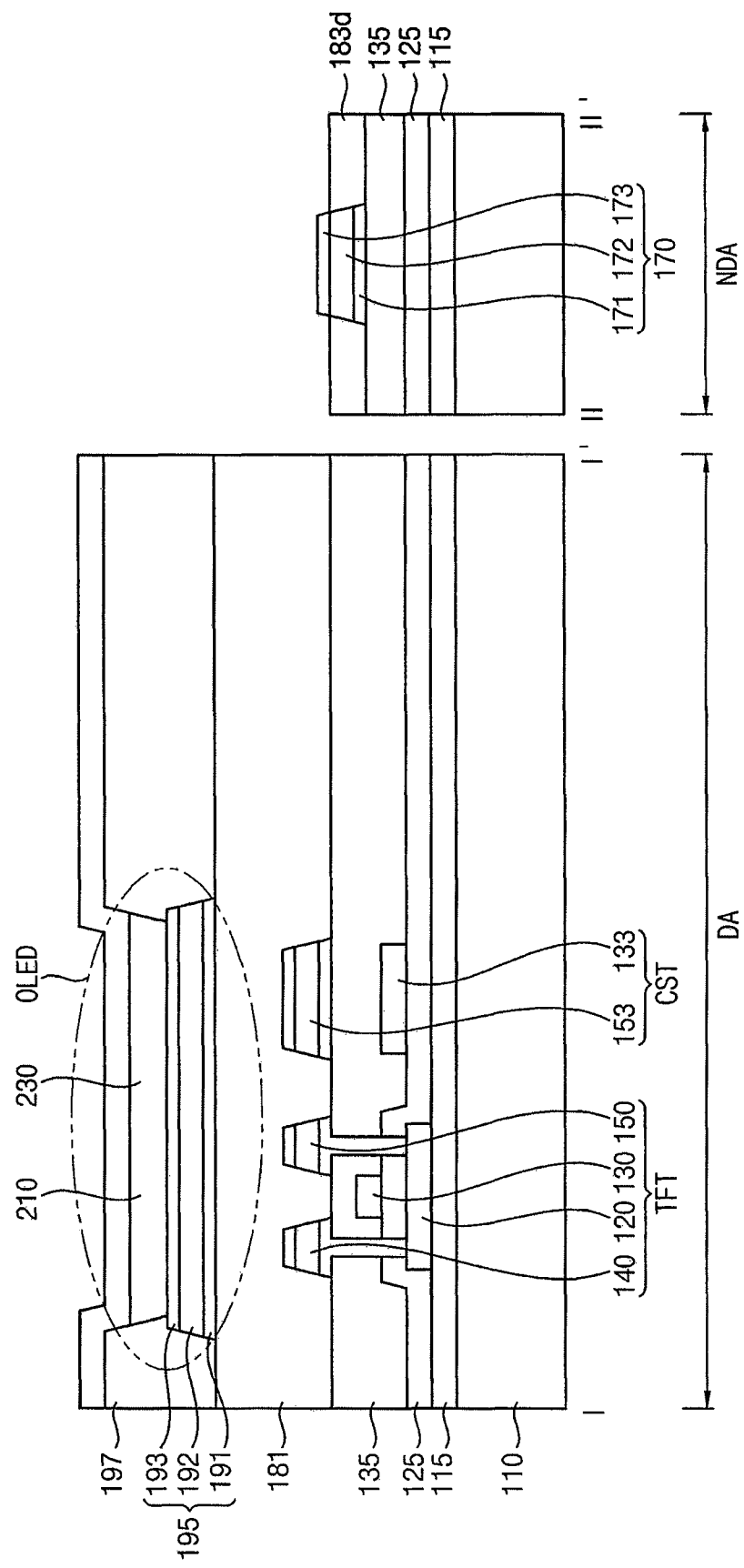
FIG. 3 illustrates a cross-sectional view taken along lines I-I' and II-II' of FIG. 2.

FIG. 2 illustrates an enlarged view of part A of the display device of FIG. 1. FIG. 3 illustrates a cross-sectional view taken along lines I-I' and II-II' of FIG. 2.

Referring to FIGS. 2 and 3, the display device according to an exemplary embodiment may include a substrate 110, a thin film transistor TFT, a line 160, a pad electrode 170 and an organic light emitting diode OLED. The organic light emitting diode OLED may include a first electrode 195, an organic light emitting layer 210 and a second electrode 220.

The substrate 110 may be a transparent or opaque insulating substrate. For example, the substrate 110 may include glass or plastic such as polyimide PI, polycarbonate (PC), polyethersulfone (PES), polyethylene terephthalate (PET), polyacrylate, or the like.

The buffer layer 115 may be disposed on the substrate 110. The buffer layer 115 may be located in the display area DA and the non-display area NDA. The buffer layer 115 may help to block impurities such as oxygen, water, etc., from penetrating through the substrate 110. In addition, the buffer layer 115 may provide a flat surface on a top surface of the substrate 110. The buffer layer 115 may include silicon nitride, silicon oxide, silicon oxynitride, or the like. In some implementations, the buffer layer 115 may be omitted.

A thin film transistor TFT and a storage capacitor CST may be disposed on the buffer layer 115 in the display area DA. The thin film transistor TFT may include a semiconductor layer 120, a gate electrode 130, a source electrode 140, and a drain electrode 150. In some implementations, the thin film transistor TFT may have a top-gate structure in which the gate electrode 130 is located on top of the semiconductor layer 120. In some implementations, the thin film transistor TFT may have a bottom-gate structure in which the gate electrode is located below the semiconductor layer.

The semiconductor layer 120 may be disposed on the buffer layer 115. The semiconductor layer 120 may be formed of amorphous silicon, polycrystalline silicon, an oxide semiconductor, or the like. The semiconductor layer 120 may include a source area, a drain area, and a channel area formed therebetween.

A gate insulating layer 125 may be disposed on the buffer layer 115 and may cover the semiconductor layer 120. The gate insulating layer 125 may be located in the display area DA and the non-display area NDA. The gate insulating layer 125 may insulate the gate electrode 130 from the semiconductor layer 120. The gate insulating layer 125 may include silicon nitride, silicon oxide, silicon oxynitride, or the like.

The gate electrode 130 may be disposed on the gate insulating layer 125. The gate electrode 130 may overlap the channel region of the semiconductor layer 120. The gate electrode 130 may be formed of a first metal layer. The first metal layer may include a metal or an alloy of metals such as molybdenum (Mo), aluminum (Al), copper (Cu), or the like.

An insulating interlayer 135 covering the gate electrode 130 may be disposed on the gate insulating layer 125. The insulating interlayer 135 may be located in the display area DA and the non-display area NDA. The insulating interlayer 135 may insulate the source electrode 140 and the drain electrode 150 from the gate electrode 130. The insulating interlayer 135 may include silicon nitride, silicon oxide, silicon oxynitride, or the like.

The source electrode 140 and the drain electrode 150 may be disposed on the insulating interlayer 135. The source electrode 140 and the drain electrode 150 may be connected to the source area and the drain area of the semiconductor layer 120 through contact holes formed in the insulating interlayer 135 and the gate insulating layer 125, respectively. The source electrode 140 and the drain electrode 150 may be formed of a second metal layer. The second metal layer may include an aluminum alloy. The aluminum alloy may include any one of copper (Cu), vanadium (V), and silicon (Si). The second metal layer may include a first layer 171, a second layer 172, and a third layer 173, which are sequentially stacked.

For example, the first layer 171 may be disposed on a lower surface of a second layer 172, and a third layer 173 may be disposed on the upper surface of the second layer 172. The first layer 171, the second layer 172, and the third layer 173 may include titanium (Ti), an aluminum alloy, and titanium (Ti), respectively.

The storage capacitor CST includes a first storage electrode 133 formed of a same first metal layer as the gate electrode 130 and a second storage electrode 153 formed of a same second metal layer as the source and drain electrodes. The second storage electrode 153 may overlap the first storage electrode 133. The storage capacitor CST may be defined in an overlapping area of the first and second storage electrodes 133 and 153.

The line 160 and a pad electrode 170 connected to an end portion of the line 160 may be disposed on the insulating interlayer 135 of the non-display area NDA.

The line 160 may be formed of the same second metal layer as the source electrode 140 and the drain electrode 150. The line 160 may include a first layer 171, a second layer 172, and a third layer 173, which are sequentially stacked. The second layer 172 of the line 160 may serve as a main-line layer. The first layer 171 and the third layer 173 of the line 160 may serve as auxiliary line layers for protecting bottom and top surfaces of the second layer 172, respectively.

The pad electrode 170 may be formed of the same second metal layer as the source electrode 140 and the drain electrode 150. The pad electrode 170 may be formed integrally with the line 160. The pad electrode 170 may include a first layer 171, a second layer 172, and a third layer 173, which are sequentially stacked. The second layer 172 of the pad electrode 170 may serve as a main-electrode layer. The first layer 171 and the third layer 173 of the pad electrode 170 may serve as auxiliary-electrode layers for protecting the bottom and top surfaces of the second layer 172, respectively.

According to an exemplary embodiment, a sacrificial layer remnant 183d (e.g., a capping layer 183d) may cap a side surface of the pad electrode 170 disposed in the non-display area NDA.

The sacrificial layer remnant 183d may prevent a side surface of the pad electrode 170 from being exposed. The side surfaces of the first and second layers 171 and 172 of the first, second and third layers 171, 172 and 173 of the pad electrode 170 may be prevented from being exposed.

The sacrificial layer remnant 183d may cap the side surface of the second layer 172 of the pad electrode 170 to protect the main-electrode layer of the pad electrode 170 from damage such as corrosion.

In addition, the sacrificial layer remnant 183d may cap a side surface of the line 160 disposed in the non-display area NDA.

The sacrificial layer remnant 183d may cap the side surface of the second layer 172 of the line 160 to protect the main-line layer of the line 160 from damage such as corrosion.

A planarization layer 181 having a thick thickness may be disposed on the insulating interlayer 135 in the display area DA to cover the source electrode 140 and the drain electrode 150. The planarization layer 181 may insulate the first electrode 195 from the source electrode 140 and the drain electrode 150. The planarization layer 181 may include an organic material such as an acrylic resin, an epoxy resin, a polyimide resin, and a polyester resin.

According to an exemplary embodiment, the thickness of the planarization layer 181 may be reduced by a predetermined amount through a CMP (Chemical Mechanical Polishing) polishing process, thereby eliminating a thickness difference that could be caused by the presence of the stacked layers disposed under the planarization layer 181.

The first electrode 195 may be disposed on the planarization layer 181 in the display area DA. The first electrode 195 may be connected to the drain electrode 150 of the thin film transistor TFT through a contact hole formed in the planarization layer 181.

In an exemplary embodiment, the first electrode 195 may include a first layer 191, a second layer 192, and a third layer 193 that are sequentially stacked. For example, the first layer 191 may be disposed on the lower surface of the second layer 192, and the third layer 193 may be disposed on the upper surface of the second layer 192.

The first layer 191, the second layer 192, and the third layer 193 of the first electrode 195 may include indium tin oxide (ITO), silver, and indium tin oxide, respectively. The second layer 192 of the first electrode 195 may serve as the main-electrode layer. The first layer 191 and the third layer 193 of the first electrode 195 may serve as an auxiliary-electrode layer protecting the bottom and top surfaces of the second layer 192, respectively.

A pixel definition layer 197 covering the first electrode 195 may be disposed on the planarization layer 181 in the display area DA. The pixel definition layer 197 may insulate the second electrode 220 from the first electrode 195. The pixel definition layer 197 may include an opening exposing a top surface of the first electrode 195 and may define a light emitting area. The pixel definition layer 197 may include an organic material such as an acrylic resin, an epoxy resin, a polyimide resin, and a polyester resin.

The organic light emitting layer 210 may be disposed in the opening that exposes the top surface of the first electrode 195. The organic light emitting layer 210 may include a low molecular organic compound or a high molecular organic compound.

In one exemplary embodiment, the organic light emitting layer 210 may emit red light, green light, or blue light. In some implementations, when the organic light emitting layer 210 emits white light, the organic light emitting layer 210 may have a multilayer structure including a red light emitting layer, a green light emitting layer, and a blue light emitting layer, or may include a single layer structure including a red light emitting material, a green light emitting material, and a blue light emitting material.

The second electrode 220 may be disposed on the organic light emitting layer 210 in the display area DA. The second electrode 220 may be disposed on the organic light emitting layer 210 and the pixel definition layer 197. The second electrode 220 may include lithium (Li), calcium (Ca), lithium fluoride (LiF), aluminum (Al), magnesium (Mg), or combinations thereof.

FIGS. 4 to 9 are cross-sectional views illustrating stages of a method of manufacturing a display device according to an exemplary embodiment.

Figure 4:
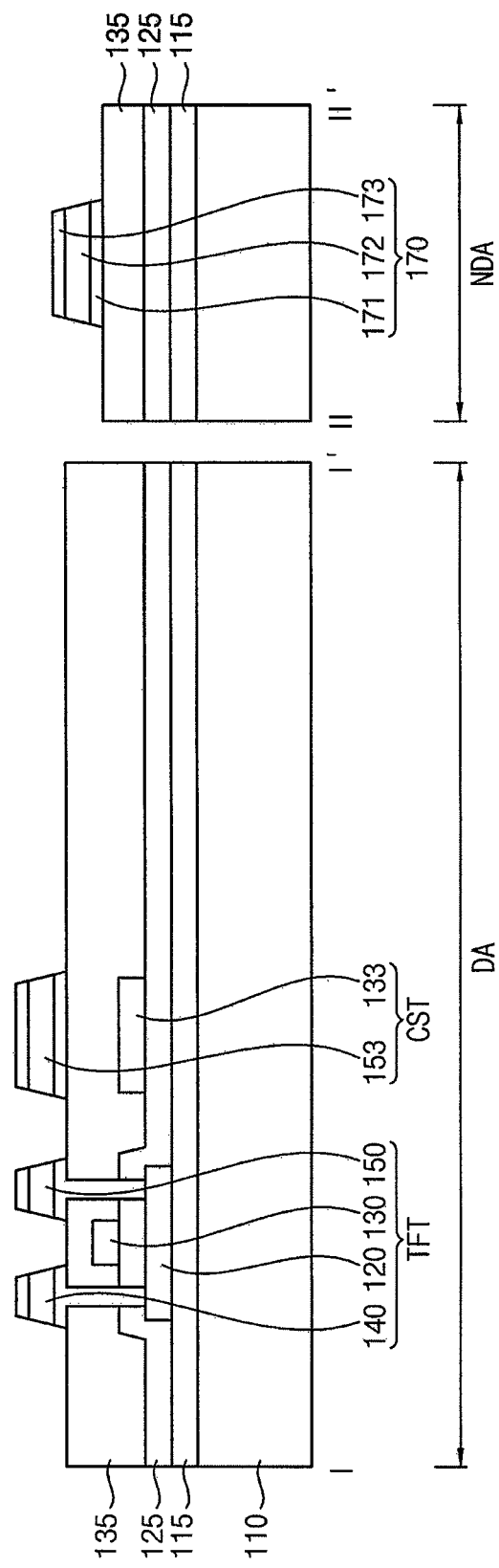
FIGS. 4 to 9 illustrate cross-sectional views of stages of a method of manufacturing a display device according to one exemplary embodiment.

Referring to FIG. 4, a thin film transistor TFT, a line 160, and a pad electrode 170 may be formed on the substrate 110.

The buffer layer 115 may be formed on the display area DA on the substrate 110 and the non-display area NDA. For example, the buffer layer 115 may be formed by a suitable method such as chemical vapor deposition, sputtering, etc. using silicon oxide, silicon nitride, silicon oxynitride, or the like.

The semiconductor layer 120 may be formed in the display area DA of the substrate 110 on which the buffer layer 115 is formed. For example, a semiconductor layer 120 may be formed by forming a layer including a silicon-containing material, an oxide semiconductor, or the like on the entire surface of the buffer layer 115 and patterning the formed layer. When the semiconductor layer 120 is formed using the silicon-containing material, an amorphous silicon layer may be formed on an entire surface of the buffer layer 115 and crystallized to form a polycrystalline silicon layer. Thereafter, after the semiconductor layer 120 is patterned, impurities may be doped on both sides of the patterned polysilicon layer to form a semiconductor layer 120 including a source area, a drain area, and a channel area therebetween.

A gate insulating layer 125 may be formed on the display area DA and the non-display area NDA of the substrate 110 on which the semiconductor layer 120 is formed. For example, the gate insulating layer 125 may be formed using silicon oxide, silicon nitride, silicon oxynitride, or the like.

A first metal layer may be formed on the gate insulating layer 125. The first metal layer may be patterned to form a gate electrode 130 and a first storage electrode 133 in the display area DA. The gate electrode 130 may overlap the semiconductor layer 120. The first metal layer may be formed using a metal, a metal alloy, or the like.

An insulating interlayer 135 may be formed on the display area DA and the non-display area NDA in which the gate electrode 130 and the first storage electrode 133 are formed. For example, the insulating interlayer 135 may be formed using silicon oxide, silicon nitride, silicon oxynitride, or the like A plurality of contact holes exposing the semiconductor layer 120 may be formed in the insulating interlayer 135 and the gate insulating layer 125. For example, the contact holes may expose the source and drain areas of the semiconductor layer 120, respectively.

A second metal layer may be formed on the substrate 110 on which the insulating interlayer 135 is formed, and the second metal layer may be patterned. The second metal layer may be used to form a source electrode 140, a drain electrode 150 and a second storage electrode 153 in the display area DA and the line 160 and the pad electrode 170 in the non-display area NDA.

The second metal layer may include an aluminum alloy. The aluminum alloy may include any one of copper (Cu), vanadium (V), and silicon (Si).

According to an exemplary embodiment, the second metal layer may have a multi-layer structure including a first layer 171, a second layer 172, and a third layer 173 that are sequentially stacked. For example, the second metal layer may include a layer including titanium (Ti), a layer including aluminum alloy, and a layer including titanium on the insulating interlayer 135, sequentially stacked. Accordingly, each of the source electrode 140, the drain electrode 150, the second storage electrode 153, the line 160, and the pad electrode 170 may have a stacked structure of Ti/aluminum alloy/Ti.

Figure 5:
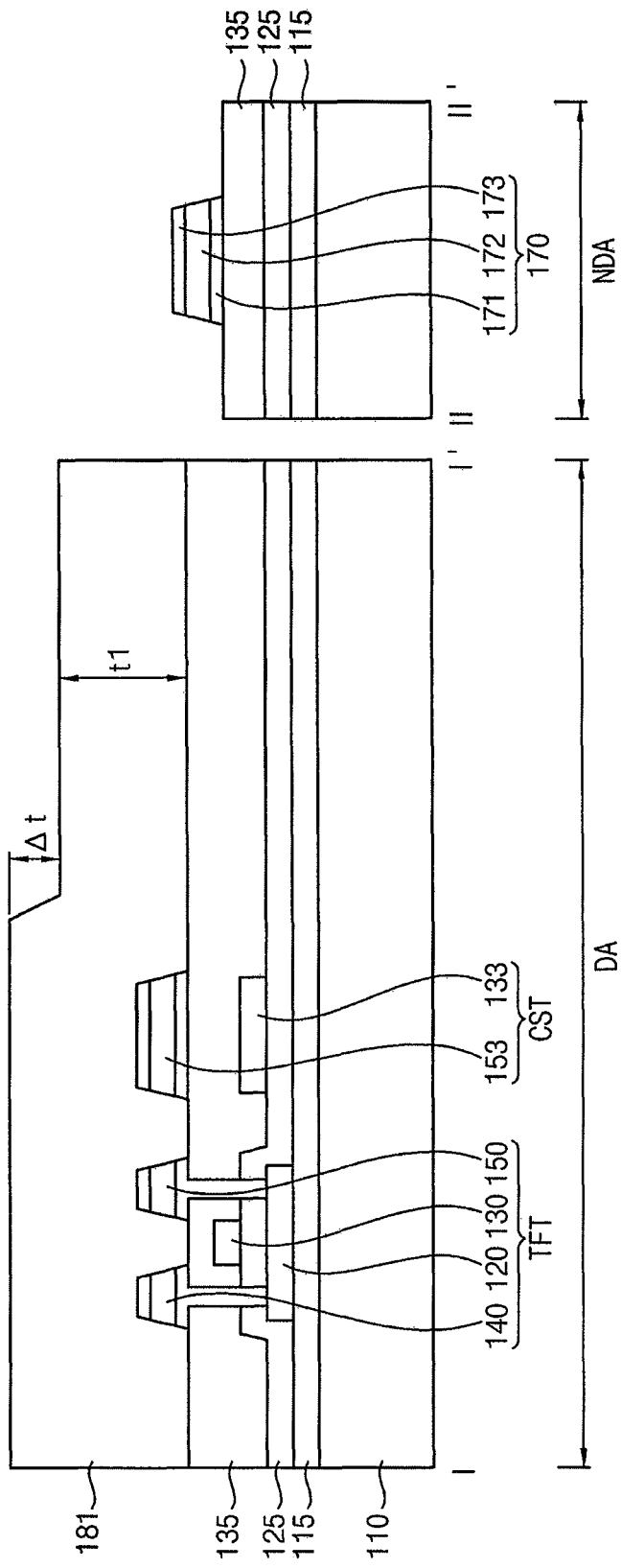

Referring to FIG. 5, a planarization layer 181 covering the source electrode 140 and the drain electrode 150 may be formed with a first thickness t1 in the display area DA in which the insulating interlayer 135 is formed.

The planarization layer 181 may include a contact hole exposing the drain electrode 150 in the display area DA. The planarization layer 181 may be removed in the non-display area NDA, so that the line 160 and the pad electrode 170 are exposed. The planarization layer 181 may be formed of, for example, a polyimide resin, a photoresist, an acrylic resin, a polyamide resin, a siloxane resin, or the like.

The planarization layer 181 in the display area DA may have a thickness difference Δt of about 0.3 μm according to a thickness difference in the stacked structure under the planarization layer 181.

A CMP process may be performed to remove the thickness difference Δt existing in the planarization layer 181 in the display area DA.

Figure 6:
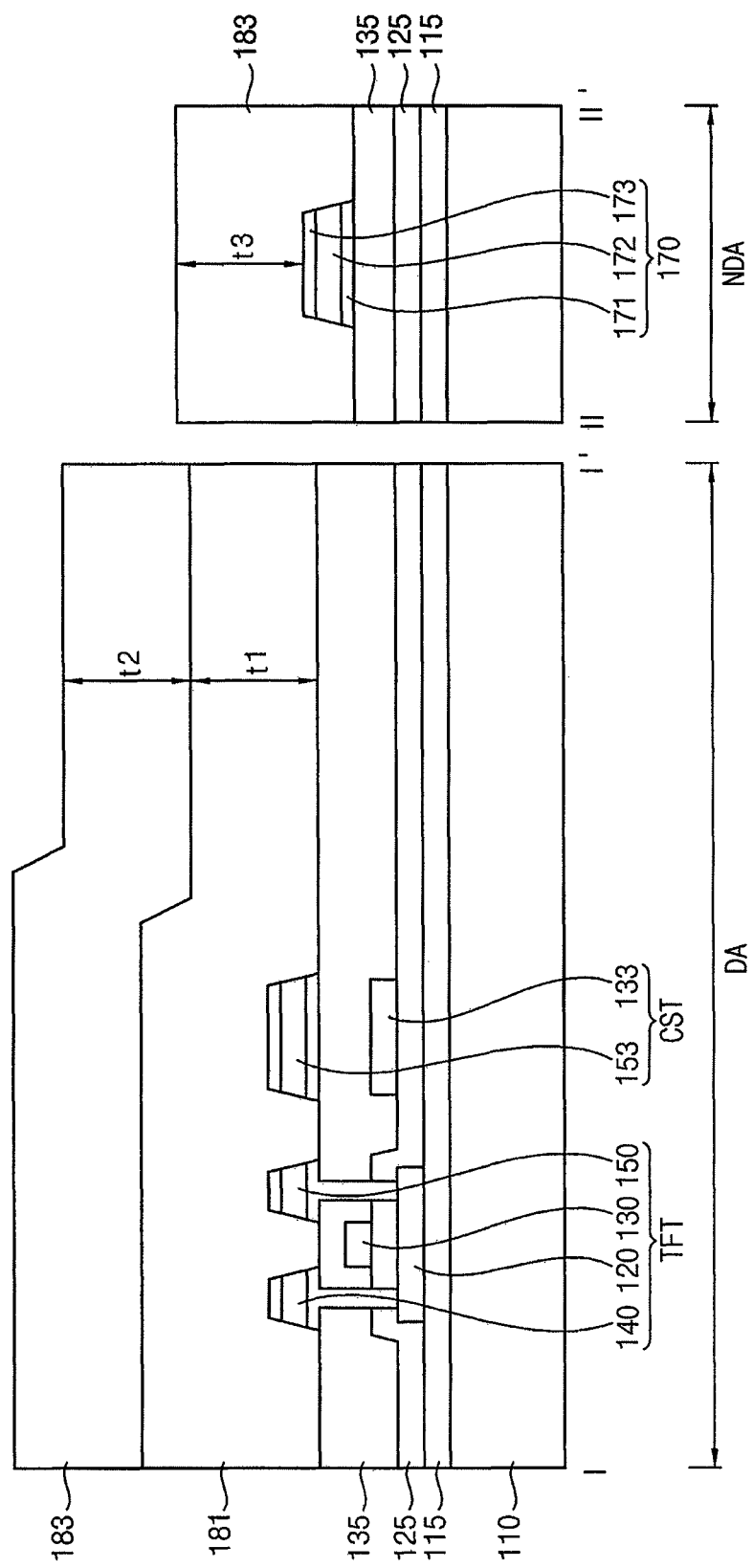

Referring to FIG. 6, for the CMP process, a sacrificial layer 183 may be formed on the substrate 110 on which the planarization layer 181 is formed. The sacrificial layer 183 may be formed with a second thickness t2 in the display area DA. The sacrificial layer 183 may be formed with a third thickness t3 in the non-display area NDA. The third thickness t3 may be defined from a top surface of the pad electrode 170 to a top surface of the sacrificial layer 183 in the non-display area NDA.

The sacrificial layer 183 may include a material having an etch selectivity different from that of the planarization layer 181.

According to one exemplary embodiment, the sacrificial layer 183 may be formed of an organic material such as a photoresist.

According to one exemplary embodiment, the sacrificial layer 183 may be formed of an inorganic material such as silicon oxide, silicon nitride, indium zinc oxide IZO, or the like.

Figure 7:
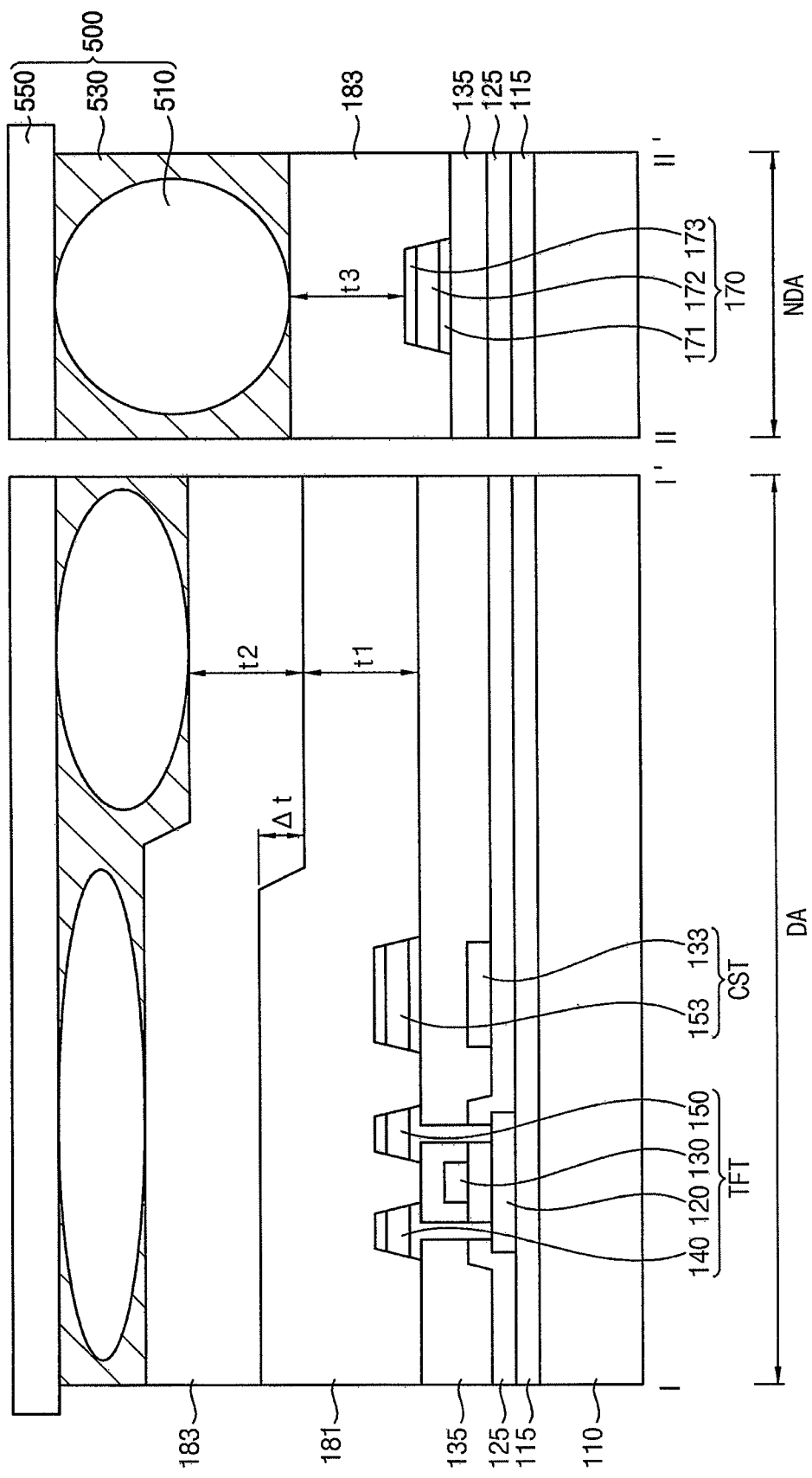

Referring to FIG. 7, the substrate 110 on which the sacrificial layer 183 is formed may be subjected to a CMP process using a CMP apparatus.

The CMP apparatus 500 may include a slurry 530 and a polishing pad 550.

The slurry 530 may include a plurality of polishing particles 510.

The slurry 530 may have a polishing rate ratio different from the polishing rate ratio of the planarization layer 181 and the polishing rate ratio of the sacrificial layer 183.

According to one exemplary embodiment, the polishing rate ratio of the planarization layer 181 and the sacrificial layer 183 may be up to 10:1.

According to one exemplary embodiment, the polishing rate ratio of the planarization layer 181 and the sacrificial layer 183 may be variously adjusted according to material properties and coating conditions of the sacrificial layer 183. For example, when the third thickness t3 of the sacrificial layer 183 formed in the non-display area NDA is greater than the first thickness t1 of the planarization layer 181 formed in the display area DA, the polishing rate ratio of the sacrificial layer 183 may be adjusted to be greater than the polishing rate ratio of the planarization layer 181. However, when the third thickness t3 of the sacrificial layer 183 formed in the non-display area NDA is less than the first thickness t1 of the planarization layer 181 formed in the display area DA, the polishing rate ratio of the sacrificial layer 183 may be adjusted to be less than the polishing rate ratio of the planarization layer 181.

In the CMP process, considering that the upper surface of the pad electrode 170 formed in the non-display area NDA is exposed, the slurry 530 may include a corrosion inhibitor of the material of the third layer 173 corresponding to the upper surface of the pad electrode 170. For example, the slurry 530 may comprise a corrosion inhibitor of titanium (Ti).

The hard polishing pad 550 may press the slurry 530 to perform the CMP process of the substrate to be processed. A distance between the sacrificial layer 183 and the polishing pad 550 in the display area may be relatively small and a distance between the sacrificial layer 183 and the polishing pad 550 may be relatively large in the non-display area NDA. A pressure of the plurality of polishing particles of the slurry 530 in the display area DA may be greater than a pressure of the plurality of polishing particles of the slurry 530 in the non-display area NDA. Thus, the pad electrode 170 of the non-display area NDA may be prevented from being damaged from the polishing process, while the planarization process efficiency of the planarization layer 181 in the display area DA may be increased.

According to one exemplary embodiment, when the sacrificial layer 183 is formed of an organic material similar to that of the planarization layer 181, the sacrificial layer 183 and the planarization layer 181 may be simultaneously subjected to the CMP process using the slurry 530 having a polishing rate ratio different from polishing rate ratios of sacrificial layer 183 and the planarization layer 181.

Figure 8:
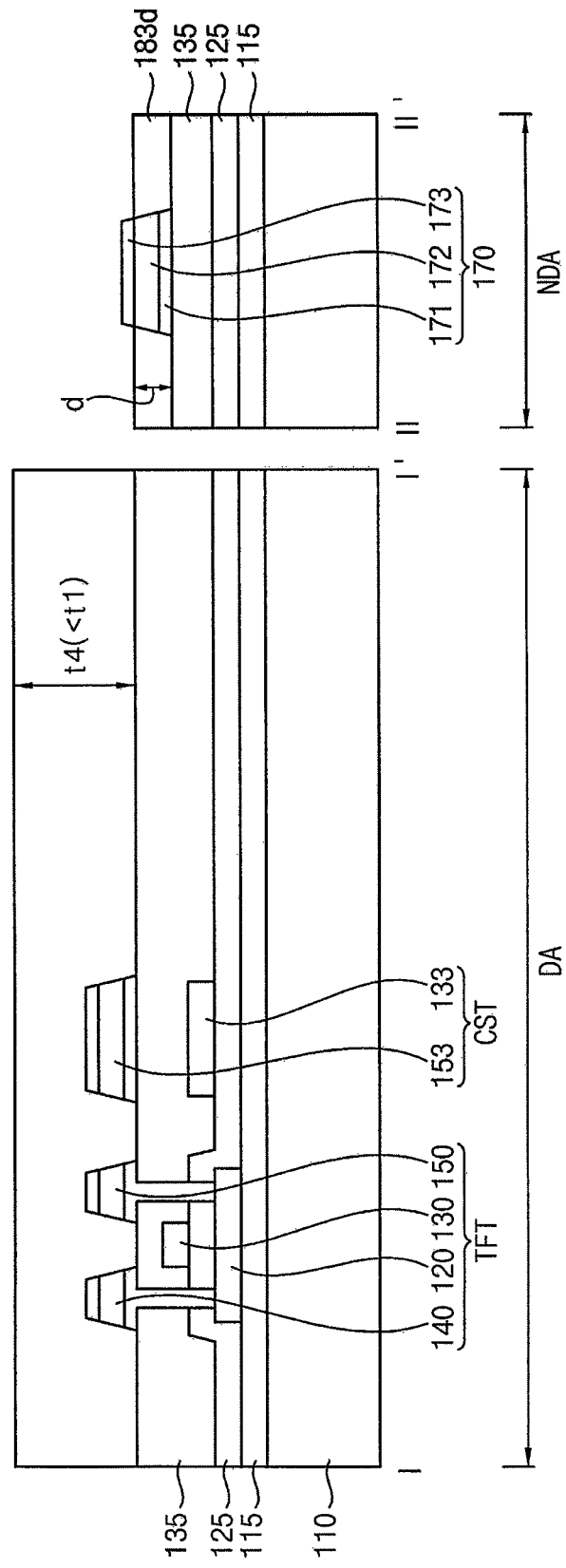

Referring to FIG. 8, the sacrificial layer 183 in the display area DA may be completely removed through the CMP process, and the planarization layer 181 may be partially removed. A thickness difference Δt of about 0.3 μm existing in the planarization layer 181 in the display area DA may be removed. The planarization layer 181 in the display area DA may have a fourth thickness t4 that is thinner than the first thickness t1 before the CMP process and may have a flat surface.

The sacrificial layer 183 in the non-display area DA may be partially removed to expose the upper surface of the pad electrode 170. The side surface of the pad electrode 170 may be capped by the remaining portion of the sacrificial layer 183d having the thickness d of the pad electrode 170. By capping the side surface of the pad electrode 170, the remaining portion of the sacrificial layer 183d, referred to hereinafter as the "sacrificial layer remnant 183d" may protect the second layer 172, which is the main-electrode layer of the pad electrode 170, from damage such as corrosion.

According to one exemplary embodiment, if the sacrificial layer 183 were to be formed of an inorganic material different from that of the planarization layer 181, it could be difficult to control the polishing rate ratio of the sacrificial layer 183 and the planarization layer 181. The sacrificial layer 183 and the planarization layer 181 may be subjected to a CMP process using different slurries 530, respectively.

First, a first polishing process may be performed using a first slurry 530 for removing an inorganic material, thereby removing the sacrificial layer 183 formed of the inorganic material in the display area DA and in the non-display area NDA.

Next, a second polishing process is performed using a second slurry 530 for removing organic material, thereby removing some thickness of the planarization layer 181 formed of an organic material in the display area DA. A thickness difference Δt of about 0.3 μm existing in the planarization layer 181 in the display area may be removed.

Referring to FIG. 8, the planarization layer 181 in the display area may have a fourth thickness t4 that is thinner than the first thickness t1 before the CMP process and may have a flat surface.

When the sacrificial layer 183 in the non-display area DA is removed, the top surface of the pad electrode 170 may be exposed, and the side surface of the pad electrode 170 may remain covered by the sacrificial layer 830 formed with the thickness d of the pad electrode 170. The sacrificial layer remnant 183d remaining on the side surface of the pad electrode 1701 may cap the side surface of the pad electrode 170. The sacrificial layer 183d may protect the second layer 172, which is the main-electrode layer of the pad electrode 170, from damage such as corrosion.

Thus, through the CMP process, the planarization layer 181 in the display area DA may have a flat surface. In addition, the side surface of the pad electrode 170 of the non-display area NDA may be capped by the sacrificial layer remnant 183d.

The side surface of the line 160 of the non-display area NDA shown in FIG. 2 may also be capped by the sacrificial layer remnant 183d. Accordingly, the second layer 172, which is the main-line layer of the line 160 of the non-display area NDA, may be protected from damage such as corrosion.

Figure 9:
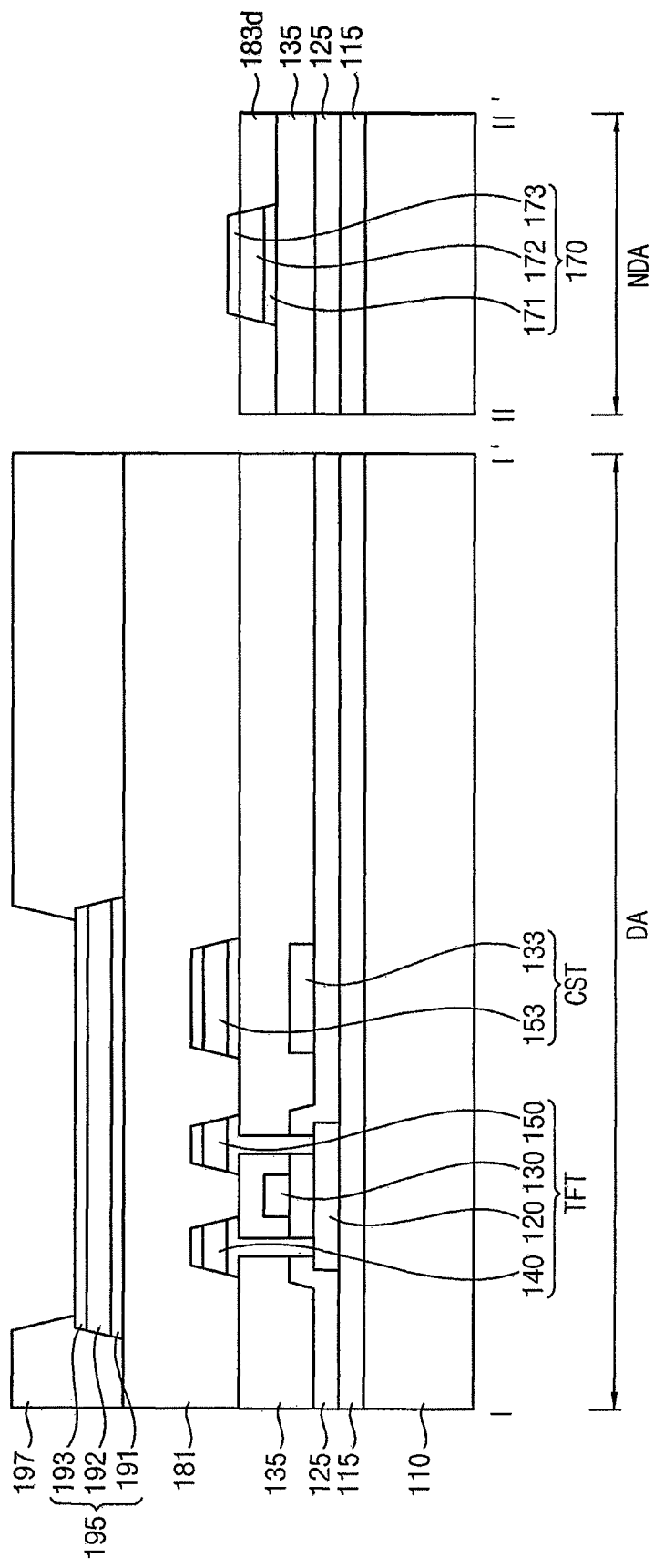

Referring to FIG. 9, a first electrode 195 may be formed on the planarization layer 181 planarized by the CMP process. The first electrode 195 may include a first layer 191, a second layer 192, and a third layer 193, which are sequentially stacked. For example, the first electrode 195 may have a stacked structure of ITO/Ag/ITO by sequentially depositing a layer including indium tin oxide (ITO), a layer including silver (Ag), and a layer including indium tin oxide (ITO).

A pixel definition layer 197 having an opening exposing the first electrode 195 may be formed in a display area DA on the substrate 110 on which the first electrode 195 is formed.

For example, the pixel definition layer 197 may be formed of a polyimide resin, a photoresist, an acryl resin, a polyamide resin, a siloxane resin, or the like.

Referring to FIG. 3, the organic light emitting layer 210 may be formed in the opening of the pixel definition layer 197. For example, the organic light emitting layer 210 may be formed of a low molecular weight organic compound or a high molecular weight organic compound using screen printing, inkjet printing, vapor deposition, or the like.

The second electrode 220 may be formed on the substrate 110 on which the pixel definition layer 197 and the organic light emitting layer 210 are formed. For example, the second electrode 220 may be formed of lithium (Li), calcium (Ca), lithium fluoride (LiF), aluminum (Al), magnesium (Mg), or the like.

Embodiments may be applied to a display device and an electronic device having the display device. For example, embodiments may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

By way of summation and review, a flat display device may be formed with a circuit layer including an optical element in a display area and a transistor and a capacitor for driving the optical element. The circuit layer is stacked with a plurality of metal layers and a plurality of insulating layers. Accordingly, an optical element disposed on the pixel circuit is disposed. In order to improve the optical characteristics and optical efficiency of the optical element, a planarization layer is formed with a thick thickness to planarize the thickness difference by the pixel circuit before forming the optical element. Nevertheless, it may be difficult to remove the thickness difference due to the complexity of the stacked structure under the planarization layer.

Embodiments provide a display device for improving optical characteristics due to planarization of a display area and a method of manufacturing the display device.

The planarization layer of a display area may be planarized by the CMP process using the sacrificial layer to remove the thickness difference of the planarization layer.

Accordingly, optical characteristics and light efficiency of the display area may be improved. The sacrificial layer remnant remaining in the non-display area of the display device may protect the pad electrode and the line from damage such as corrosion by capping the side surface of the pad electrode and line.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device comprising:
 a planarization layer covering transistors in a display area on a substrate;
 an organic light emitting diode on the planarization layer;
 a pad electrode in a non-display area on the substrate, the non-display area surrounding the display area; and
 a capping layer capping a side surface of the pad electrode, the capping layer including a material different from that of the planarization layer, wherein
 the pad electrode includes a first layer on the substrate, a second layer on the first layer, and a third layer on the second layer,
 the capping layer does not extend directly under the planarization layer,
 the capping layer does not overlap a top surface of the pad electrode,
 the capping layer covers side surfaces of the first and second layers of the pad electrode, and does not cover at least a part of a side surface of the third layer of the pad electrode,
 the capping layer has a flat top surface lower than the top surface of the pad electrode, and
 the capping layer is a remnant of a different layer than that of the planarization layer.

2. The display device as claimed in claim 1, wherein the capping layer includes a material having an etch selectivity different from an etch selectivity of the planarization layer.

3. The display device as claimed in claim 1, wherein the first layer and the third layer include titanium, and the second layer includes an aluminum alloy.

4. The display device as claimed in claim 1, further comprising:
 a line in the non-display area, the line being connected to the pad electrode, wherein a side surface of the line is capped by the capping layer.

5. The display device as claimed in claim 4, wherein the line includes the first layer, the second layer and the third layer, which are sequentially stacked, and the capping layer caps side surfaces of the first and second layers of the line.

6. The display device as claimed in claim 1, wherein the organic light emitting diode includes:
 a first electrode on the planarization layer;
 a pixel definition layer that includes an opening that exposes the first electrode;
 an organic light emitting layer in the opening of the pixel definition layer; and
 a second electrode on the organic light emitting layer.

7. The display device as claimed in claim 1, wherein the capping layer exposes an upper surface of the pad electrode.

8. The display device as claimed in claim 1, wherein the capping layer is disposed in the non-display area.

9. The display device as claimed in claim 8, wherein the capping layer does not overlap the planarization layer.

10. The display device as claimed in claim 1, wherein the capping layer does not overlap the planarization layer.

11. The display device as claimed in claim 10, wherein the capping layer exposes an entire upper surface of the pad electrode.

12. The display device as claimed in claim 1, wherein the capping layer overlaps a majority of the side surface of the pad electrode.

13. The display device as claimed in claim 1, wherein the capping layer directly contacts a majority of each side surface of the pad electrode.

14. The display device as claimed in claim 1, wherein the capping layer includes a material having an etch selectivity different from that of the planarization layer.

15. The display device as claimed in claim 1, wherein the capping layer includes an inorganic material.

* * * * *